United States Patent
Lin et al.

(10) Patent No.: US 9,024,391 B2
(45) Date of Patent: May 5, 2015

(54) SEMICONDUCTOR STRUCTURE HAVING STRESSOR

(71) Applicant: Taiwan Semiconductor Manufacturing Company, Ltd., Hsinchu (TW)

(72) Inventors: Mei-Hsuan Lin, Tainan (TW);
Chih-Hsun Lin, Tainan (TW);
Chih-Kang Chao, Tainan (TW);
Ling-Sung Wang, Tainan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 14/494,252

(22) Filed: Sep. 23, 2014

(65) Prior Publication Data

US 2015/0041857 A1  Feb. 12, 2015

Related U.S. Application Data

(62) Division of application No. 13/188,976, filed on Jul. 22, 2011, now Pat. No. 8,846,492.

(51) Int. Cl.
*H01L 21/70* (2006.01)
*H01L 29/78* (2006.01)
*H01L 27/092* (2006.01)
*H01L 29/06* (2006.01)

(52) U.S. Cl.
CPC .......... *H01L 29/7848* (2013.01); *H01L 27/092* (2013.01); *H01L 29/0653* (2013.01)

(58) Field of Classification Search
CPC ................... H01L 2924/00; H01L 2924/0002; H01L 21/823878; H01L 21/823807; H01L 21/76224
USPC .................. 257/374, 510, 646, 774, E23.011
See application file for complete search history.

(56) References Cited

U.S. PATENT DOCUMENTS

| | | |
|---|---|---|
| 2006/0211245 A1 | 9/2006 | Maszara |
| 2008/0032468 A1 | 2/2008 | Cheng et al. |
| 2008/0169490 A1 | 7/2008 | Kawai |
| 2008/0308874 A1 | 12/2008 | Letavic et al. |
| 2009/0184341 A1 | 7/2009 | Chong et al. |
| 2011/0212590 A1* | 9/2011 | Wu et al. ........................ 438/303 |
| 2012/0104498 A1* | 5/2012 | Majumdar et al. ............ 257/351 |

* cited by examiner

*Primary Examiner* — Michelle Mandala
(74) *Attorney, Agent, or Firm* — Lowe Hauptman & Ham, LLP (57) ABSTRACT

A semiconductor structure includes a substrate, a shallow trench isolation (STI) structure embedded in the substrate, a stressor embedded in the substrate, and a conductive plug over and electrically coupled with the stressor. A same-material region is sandwiched by the STI structure and an entire sidewall of the stressor, and the same-material region is a continuous portion of the substrate.

20 Claims, 6 Drawing Sheets

SEMICONDUCTOR STRUCTURE HAVING STRESSOR

PRIORITY CLAIM

The present application is a divisional of U.S. application Ser. No. 13/188,976, filed Jul. 22, 2011, now U.S. Pat. No. 8,846,492, the disclosure of which is incorporated herein by reference in its entirety.

TECHNICAL FIELD

The present disclosure relates to a semiconductor structure and, more particularly, to a structure and methods for manufacturing a semiconductor structure having a stressor.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as semiconductor devices, such as metal-oxide-semiconductor field-effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often implements epitaxially grown silicon (Si) to form raised source and drain features for an n-type device, and epitaxially growing silicon germanium (SiGe) to form raised source and drain features for a p-type device. Various techniques directed at shapes, configurations, and materials of these source and drain features have been implemented to try and further improve transistor device performance.

BRIEF DESCRIPTION OF THE DRAWINGS

Aspects of the present disclosure are best understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

Figure 1:
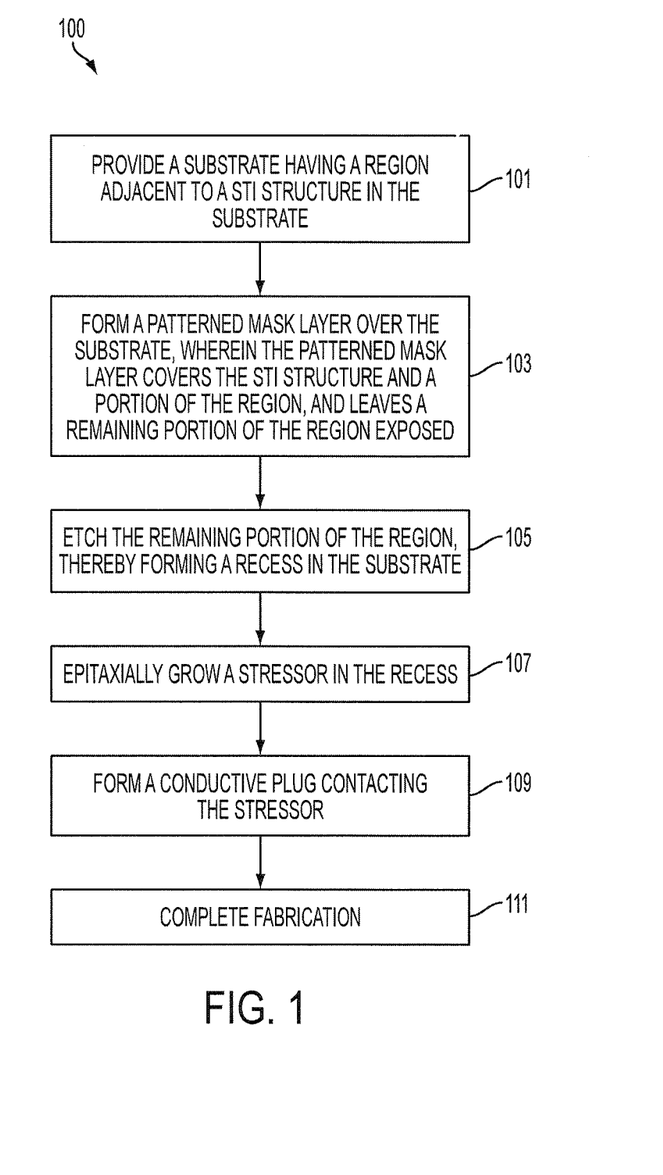
FIG. 1 is a flowchart of a method of forming a structure of an integrated circuit having a stressor according to one or more embodiments of this disclosure.
Figure 2:
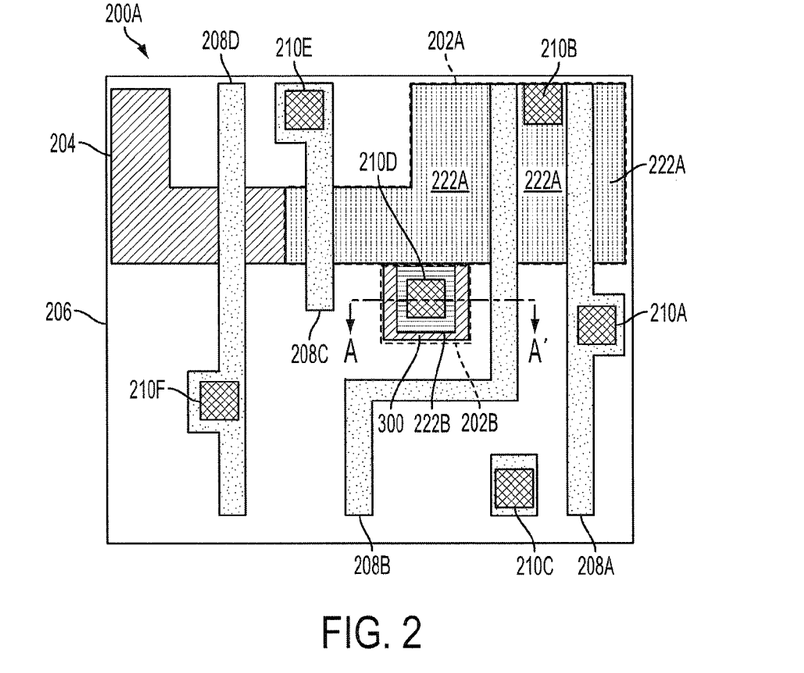
FIG. 2 is a top view of a structure of an integrated circuit having a stressor according to one embodiment of this disclosure.
Figure 3:
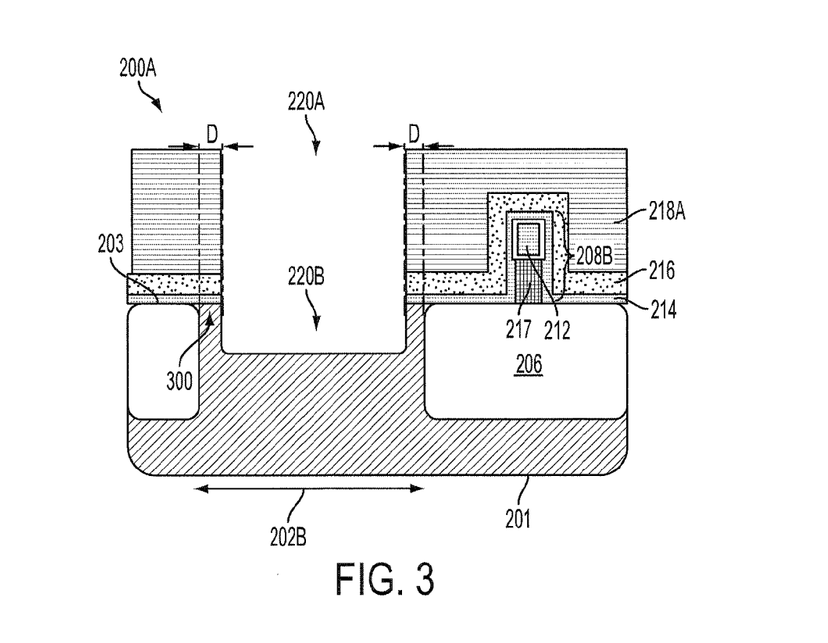
FIGS. 3 to 5 are cross-sectional views of forming the structure of an integrated circuit having a stressor of FIG. 2 at various stages of manufacture according to one embodiment of the method of FIG. 1.
Figure 4:
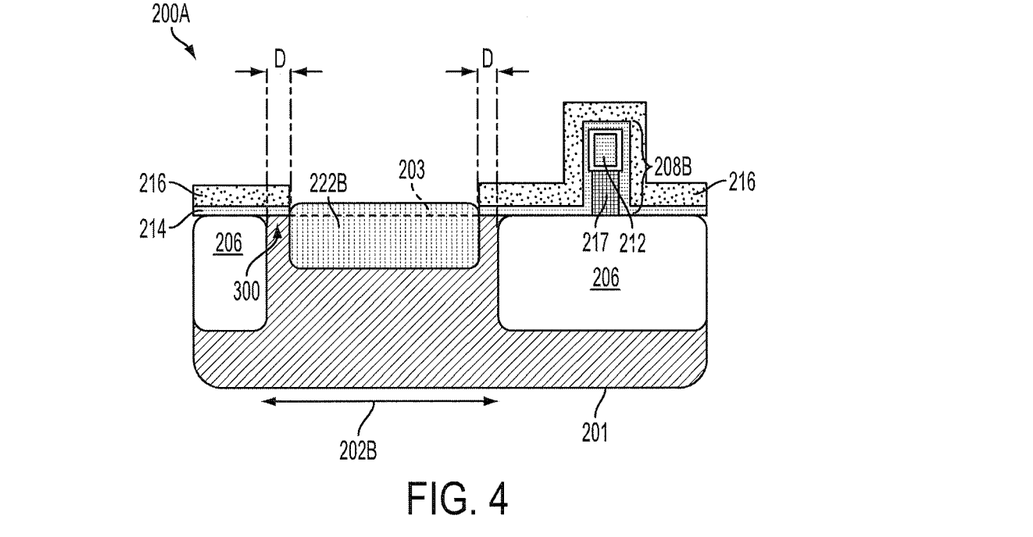
Figure 5:
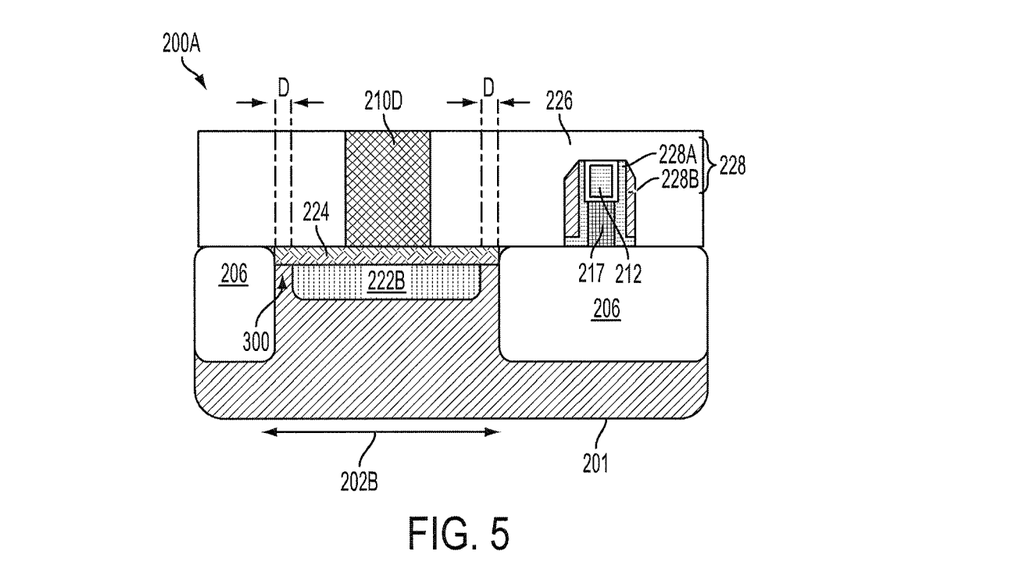
Figure 6:
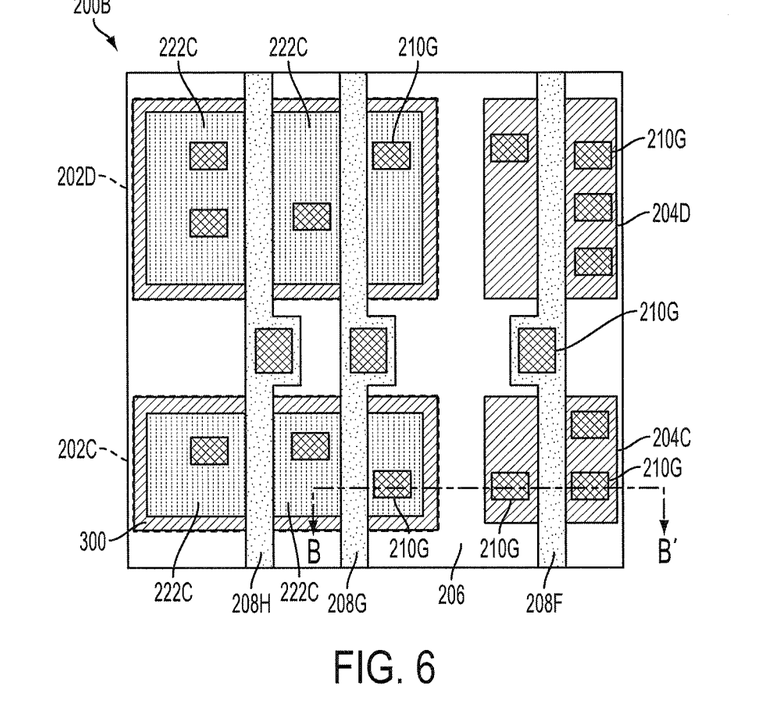
FIG. 6 is a top view of a structure of an integrated circuit having a stressor according to another embodiment of this disclosure.

FIG. 1 is a flowchart of a method 100 of forming a structure of an integrated circuit having a stressor according to one or more embodiments of this disclosure. FIG. 2 is a top view of a structure 200A of an integrated circuit having a stressor according to one embodiment of this disclosure. FIGS. 3 to 5 are cross-sectional views of forming the structure 200A (FIG. 2) of an integrated circuit having a stressor at various stages of manufacture according to one embodiment of the method of FIG. 1. FIG. 6 is a top view of a structure 200B of an integrated circuit having a stressor according to another embodiment of this disclosure. FIGS. 7 to 12 are cross-sectional views of forming the structure 200B of an integrated circuit having a stressor at various stages of manufacture according to one embodiment of the method of FIG. 1. It should be noted that additional processes may be provided before, during, or after the method 100 of FIG. 1. Various figures have been simplified for a better understanding of the inventive concepts of the present disclosure.

In this disclosure, a semiconductor substrate is provided. A plurality of chip regions is marked on the semiconductor substrate by scribe lines between the chip regions. A variety of cleaning, layering, patterning, etching and doping steps may be performed with respect to the semiconductor substrate to form integrated circuits. The term "semiconductor substrate" herein generally refers to the semiconductor bulk substrate on which various layers may be formed. In some embodiments, the semiconductor bulk substrate includes silicon or a compound semiconductor, such as GaAs, InP, Si/Ge, or SiC. Examples of such layers include dielectric layers, doped layers, polysilicon layers or conductive layers.

FIG. 2 is a top view of a semiconductor structure 200A of an integrated circuit having a stressor according to one embodiment of this disclosure. In the depicted embodiment, as will be further discussed below, the semiconductor structure 200A includes field effect transistor regions, specifically a p-channel field effect transistor (PFET) region 202 and an n-channel field effect transistor (NFET) region 204. The PFET region 202 includes PFET region 202A and PFET region 202B. The semiconductor structure 200A can further include memory cells and/or logic circuits, passive components such as resistors, capacitors, inductors, and/or fuses; and active components, such as metal-oxide-semiconductor field effect transistors (MOSFETs), complementary metal-oxide-semiconductor transistors (CMOSs), high voltage transistors, and/or high frequency transistors. The semiconductor structure 200A also includes isolation feature 206 formed in the substrate to isolate various regions of the substrate. The semiconductor structure 200A further includes various gate strips 208A-D formed over the PFET region 202A, the NFET region 204 and the isolation feature 206. In the PFET region 202A, a plurality of stressors 222A are formed in the remaining region not occupied by the gate strip 208A, B and C. The stressors 222A in the PFET region 202A are configured as a source region or a drain region. The gate strips 208A, B and C and the PFET region 202A thereunder function as transistors. With proper biases, the current carriers flow between the source regions and the drain regions in the channel regions under the gate strip 208A, B and C in the PFET region 202A. In the PFET region 202B, a stressor 222B is formed integrally connected to the stressor 222A in the PFET region 202A. The PFET region 202B further includes a buffer region 300. The buffer region 300 is a portion of the substrate 201 that is not occupied by the stressor 222B. A distance D (also referred to as a width of the buffer region 300) between an edge of the stressor 222B and an edge of the isolation feature 206 is substantially longer than 1 nanometer (nm). In NFET region 204, the remaining regions not occupied by the gate strip 208D may include various doped regions and be configured as a source region or a drain region. The gate strip 208D and the NFET region 204 thereunder function as a transistor. The semiconductor structure 200A further includes various contact plugs 210A-F. The contacts plugs 201A-F touch the PFET region 202 (including region 202A and 202B), the NFET region 204 or the gate strips 208A-D to provide electrical connections between various components. In the PFET region 202B, a current may pass through the contact plug 210D, via the stressor 222B to the stressor 222A that is configured as the source/drain region.

Referring now to FIG. 1 the flowchart of the method 100, at operation 101, a substrate is provided. The substrate has a region adjacent to a shallow trench isolation (STI) structure in the substrate.

Next, method 100 continues with operation 103 in which a patterned mask layer is formed over the substrate. The patterned mask layer covers the STI structure and a portion of the region, and leaves a remaining portion of the region exposed. A distance between an edge of the remaining portion and an edge of the STI structure is substantially longer than 1 nm.

Then, method 100 continues with operation 105 in which the remaining portion of the region is etched thereby forms a recess in the substrate.

Referring to FIG. 3, which is an enlarged cross-sectional view of a portion of the semiconductor structure 200A after performing operations 101, 103 and 105. FIG. 3 is the cross-sectional view obtained from the vertical plane crossing line A-A' in FIG. 2. In FIG. 3, a substrate 201 having a top surface 203 is provided. In the depicted embodiment, the substrate 201 is a semiconductor substrate including silicon. The substrate 201 may be a p-type or n-type substrate. Alternatively, the substrate 201 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlinAs, AlGaAs, GaInAs, GaInP, and/or GaInAsP; or combinations thereof. In yet another alternative embodiment, the substrate 201 is a semiconductor on insulator (SOI). In other alternative embodiments, semiconductor substrate 201 may include a doped epi layer, a gradient semiconductor layer, and/or a semiconductor layer overlying another semiconductor layer of a different type, such as a silicon layer on a silicon germanium layer.

Isolation feature 206 is formed in the substrate 201 to isolate various regions of the substrate 201. The isolation feature 206 also isolates the PFET regions 202 and NFET region 204 (shown in FIG. 2) from other devices (not shown). The isolation feature 206 utilizes isolation technology, such as local oxidation of silicon (LOCOS) and/or shallow trench isolation (STI), to define and electrically isolate the various regions. The isolation feature 206 comprises silicon oxide, silicon nitride, silicon oxynitride or other suitable materials.

As one example, forming an STI includes a photolithography process, etching a trench in the substrate 201 (for example, by using a dry etching and/or wet etching), and filling the trench (for example, by using a chemical vapor deposition process) with one or more dielectric materials. Then, a planarization process removes the excess isolation material outside the trench and the top surface 203 through a suitable process such as chemical mechanical polishing (CMP). The planarization process will expose the top surface 203 of active areas in the substrate 201. An isolation feature 206 is formed in the trench. In this embodiment, the isolation feature 206 refers to a shallow trench isolation (STI) structure (also referred to as the STI structure 206).

Still referring to FIG. 3, the semiconductor structure 200A includes a PFET region 202B. The PFET region 202B is adjacent to the STI structure 206. In the depicted embodiment, a gate structure 208B is formed on the STI structure 206. At the same time, a plurality of gate strips 208A-D are formed over the PFET region 202A, the NFET region 204 and the isolation feature 206 as shown in FIG. 2. The gate structure 208B as well as other gate strips includes a gate dielectric layer (not shown), a gate layer 217 and a hard mask layer 212. The gate structure 208B as well as other gate strips is formed by deposition, lithography patterning, etching processes, or combination thereof. The deposition processes include chemical vapor deposition (CVD), physical vapor deposition (PVD), atomic layer deposition (ALD), high density plasma CVD (HDPCVD) or combinations thereof. The lithography patterning processes include photoresist coating (e.g., spin-on coating), soft baking, mask aligning, exposure, post-exposure baking, developing the photoresist, rinsing, drying (e.g., hard baking) or combinations thereof. The etching processes include dry etching, wet etching, other etching methods, or combinations thereof.

The gate dielectric layer is formed over the substrate 201 and includes a dielectric material, such as silicon oxide, silicon oxynitride, silicon nitride or a high dielectric constant (high-k) dielectric material. Exemplary high-k dielectric materials include $HfO_2$, HfSiO, HfSiON, HfTaO, HfSiO, HfZrO or combinations thereof. An exemplary gate dielectric layer may be a silicon oxide layer formed by a thermal process.

The gate layer 217 is formed over the gate dielectric layer. In the present embodiment, the gate layer 217 is a polycrystalline silicon (polysilicon) layer. The polysilicon layer may be doped for proper conductivity. Alternatively, the polysilicon is not necessarily doped if a dummy gate is to be formed and replaced in a subsequent gate replacement process.

The hard mask layer 212 is formed over the gate layer 217. The hard mask layer 212 includes silicon oxide, silicon nitride, silicon oxynitride, silicon carbide or other suitable dielectric material.

In the depicted embodiment, a first dielectric cap layer 214, a second dielectric cap layer 216, and a photoresist layer 218A are formed over the semiconductor structure 200A and patterned to protect the NFET region 204 during processing of the PFET regions 202A and 202B. The first dielectric cap layer 214 may comprise an oxide material. The second dielectric cap layer 216 may comprise a nitride material. The photoresist layer 218A is patterned through a photolithography process. An exemplary photolithography process may include processing steps of photoresist coating, soft baking, mask aligning, exposing, post-exposure baking, developing photoresist, and/or hard baking. An opening 220A is formed in the patterned photoresist layer 218A to expose the underlying second dielectric cap layer 216. Portions of the first dielectric cap layer 214 and the second dielectric cap layer 216 are removed by etching through the opening 220A to expose a portion of the top surface 203 of the substrate 201. The patterned photoresist layer 218A, the patterned second dielectric cap layer 216 and the patterned first dielectric cap layer 214 forms a patterned composite mask layer. The patterned composite mask layer covers the STI structure 206 and a portion of the PFET region 202B and leaves a remaining portion of the PFET region 202B exposed. This portion of the PFET region 202B covered by the patterned composite mask layer is also referred to as a buffer region 300. A distance D (also referred to as a width of the buffer region 300) between an edge of the remaining portion of the PFET region 202B and an edge of the STI structure 206 is substantially longer than 1 nm.

Still referring to FIG. 3, an etching process then removes portions of the substrate 201 through the opening 220A to form a recess 220B in the remaining portion of the region 202B. The etching process includes a dry etching process, wet etching process, or combination thereof. For example, the dry etching process may utilize an etching pressure of about 1 milli-Torr (mTorr) to about 200 mTorr, a source power of about 200 watts (W) to about 2000 W, an RF bias voltage of about 0 volt (V) to about 100 V, and an etchant that includes $NF_3$, $Cl_2$, $SF_6$, He, Ar, $CF_4$, or combinations thereof. The wet etching solutions may include $NH_4OH$, HF (hydrofluoric acid), TMAH (tetramethylammonium hydroxide), other suitable wet etching solutions, or combinations thereof. In one example, the wet etching process first implements a 100:1 concentration of an HF solution at room temperature, and then implements a TMAH solution at a temperature of about 20° C. to about 60° C.

Referring now back to FIG. 1, method 100 continues with operation 107 in which a stressor is epitaxially grown in the recess.

FIG. 4 is a cross-sectional view of the structure 200A after the performance of operation 107 in the recess 220B. A semiconductor material is deposited in the recesses 220B to form a strained structure (also referred to as a stressor 222B) in the PFET region 202B. Simultaneously, a stressor 222A is also formed in the PFET region 202A as shown in FIG. 2. In the PFET region 202B, the stressor 222B is formed integrally connected to the stressor 222A in the PFET region 202A. In the depicted embodiment, an epitaxy or epitaxial (epi) process is performed to deposit the semiconductor material in the recesses 220B. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or a combination thereof. The epi process may use gaseous and/or liquid precursors, which may interact with the composition of the substrate 201. The deposited semiconductor material is different from the substrate 201. Accordingly, the channel region of the device in PFET region 202A is strained or stressed to enable carrier mobility of the device and enhance device performance. Further, in the depicted embodiment, silicon germanium (SiGe) is grown by an epi process in the recesses 220B in a crystalline state on the silicon substrate 201. The recess 220B is completely filled with the stressor 222B at least up to the top surface 203. The stressor 222B has a second top surface. The entire second top surface is not lower than the top surface 203 of the substrate 201. The SiGe stressor 222A in PFET region 202A may alternatively be referred to as raised source and drain regions. In some embodiments, the SiGe stressor 222A and SiGe stressor 222B are further exposed to annealing processes, such as a rapid thermal annealing process. Thereafter, the patterned dielectric cap layers 214 and 216 are removed by a suitable process.

Referring now back to FIG. 1, method 100 continues with operation 109 in which a conductive plug contacting the stressor is formed.

FIG. 5 depicts a cross-sectional view of the structure 200A after performance of operation 109. In the depicted embodiment, a material of spacer liner 228A and a material of spacer 228B are formed by blanket deposited over the semiconductor structure 200A. Then, the material of spacer liner 228A and the material of spacer 228B are anisotropically etched to form spacers 228 as illustrated in FIG. 5. The spacer liner 228A and spacers 228B are positioned adjacent the sidewalls of the gate structure 208B and also on the sidewalls of the gate strips 208A, C and D as shown in FIG. 2. The spacer liner 228A and spacer 228B may include a dielectric material, such as silicon oxide or silicon oxynitride. A silicide process is performed and silicide features 224 are formed on top portions of the stressor 222A, the stressor 222B and the substrate between the stressor 222B and the STI structure 206. The silicide features 224 may reduce the contact resistance. The silicide features 224 may be formed by a process including depositing a metal layer, annealing the metal layer such that the metal layer is able to react with silicon in the exposed substrate 201 and silicon in the stressors (222A and 222B) to form silicide, and then removing the non-reacted metal layer. After the silicide process, an inter-level dielectric (ILD) layer 226 is blanket formed over the semiconductor structure 200A covering the STI structure 206, the stressors 222A/222B and the gate strips 208A-D as shown in FIG. 2. A chemical mechanical polishing (CMP) process is further applied to the semiconductor structure 200A to planarize the ILD layer 226. An opening is etched in the ILD layer 226 to expose a portion of the silicide feature 224 on the stressor 222B. A conductive material may overfill the opening in the ILD layer 226. The conductive material may include copper or copper alloys, aluminum or tungsten. The possible formation methods include electroless plating, sputtering, electro plating or chemical vapor deposition (CVD). The excess conductive material outside of the opening is removed through a suitable process such as chemical mechanical polishing (CMP). A contact plug 210D having the conductive material is formed on the stressor 222B and contacts the silicide feature 224 on the stressor 222B. It is understood the formation of the contact plug 210D described here for the sake for illustration. In FIG. 2, the contact plugs 210A-F are also suitable for use of the formation method of the contact plug 210D.

Referring now back to FIG. 1, method 100 continues with operation 111 to complete fabrication. The processes to complete fabrication are discussed briefly below. A multilayer interconnection (MLI) including metal layers and inter-metal dielectric (IMD) is formed over the substrate 102 to electrically connect various features or structures of the semiconductor structure 200A. The multilayer interconnection includes vertical interconnects, such as vias or contacts, and horizontal interconnects, such as metal lines. A passivation layer is formed over the multilayer interconnection prevents or decreases moisture, mechanical, and radiation damage to the integrated circuits. A metal pad is formed and extends into the passivation layer to contact the most top multilayer interconnection. The metal pad provides electrical connection for the integrated circuits formed on substrate 201 to other outside components.

FIG. 6 is a top view of a semiconductor structure 200B of an integrated circuit having a stressor according to another embodiment of this disclosure. In the depicted embodiment, as will be further discussed below, the semiconductor structure 200B includes field effect transistor regions, specifically a p-channel field effect transistor (PFET) regions 202C and 202D, and an n-channel field effect transistor (NFET) region 204C and 204D. The semiconductor structure 200B can further include memory cells and/or logic circuits, passive components such as resistors, capacitors, inductors, and/or fuses; or active components, such as metal-oxide-semiconductor field effect transistors (MOSFETs), complementary metal-oxide-semiconductor transistors (CMOSs), high voltage transistors, and/or high frequency transistors. The semiconductor structure 200B also includes isolation feature 206 formed in the substrate to isolate various regions of the substrate, such as the PFET regions 202C and 202D, and the NFET regions 204C and 202D. The semiconductor structure 200B further includes various gate strips 208F-H formed over the PFET regions 202C and 202D, the NFET regions 204C and 204D and the isolation feature 206. Each of the PFET regions 202C and 220D further include a buffer region 300. The buffer region 300 is a portion of the substrate 201. In the PFET regions 202C and 202D, a plurality of stressors 222C are formed in the remaining region not occupied by the gate strips 208G-H and the buffer region 300. The stressors 222C in the PFET regions 202C and 202D are configured as a source region or a drain region. The gate strips 208G and 208H, and the PFET regions 202C and 202D thereunder function as transistors. With proper biases, the current carriers flow in the channel regions under the gate transistors between the source regions and the drain regions in the PFET regions 202C and 202D. In the PFET region regions 202C and 202D, a distance (also referred to as a width of the buffer region 300) between an edge of the stressor 222C and an edge of the isolation feature 206 is substantially longer than 1 nm. In the NFET regions 204C and 204D, the remaining regions not occupied by the gate strip 208E may include various doped regions and be configured as a source region or a drain region. The gate strip 208F and the NFET regions 204C and 204D thereunder function as transistors. The semiconductor structure 200B further includes various contact plugs 210G. The contacts plugs 201G touch the PFET region regions 202C and 202D, the NFET regions 204C and 204D or the gate strips 208F-H to provide electrical connections between various components.

FIGS. 7 to 12 are cross-sectional views of forming the structure 200B of an integrated circuit having a stressor of FIG. 6 at various stages of manufacture according to one embodiment of the method of FIG. 1. Some of the structures may be substantially similar to the embodiments disclosed in FIGS. 3 to 5 and the description of the common structures are not repeated here although fully applicable in this embodiment as well.

Figure 7:
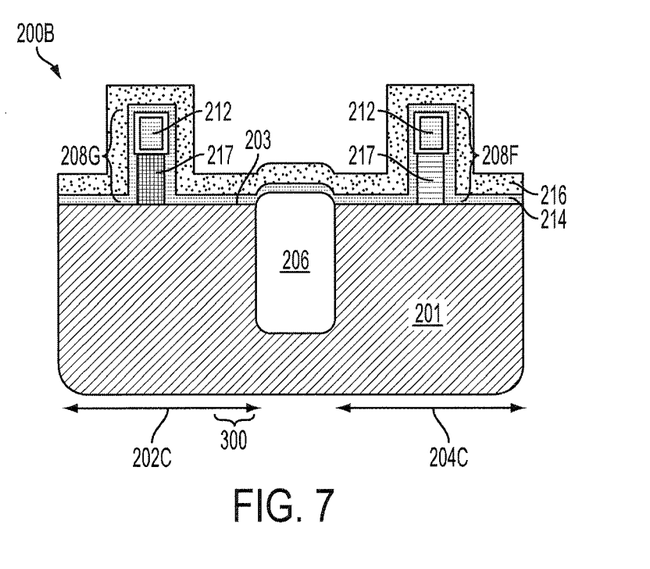
FIGS. 7 to 12 are cross-sectional views of forming the structure of an integrated circuit having a stressor of FIG. 6 at various stages of manufacture according to one embodiment of the method of FIG. 1.

Referring to FIG. 7, which is an enlarged cross-sectional view of a portion of the semiconductor structure 200B after performing operation 101. FIG. 7 is the cross-sectional view obtained from the vertical plane crossing line B-B' in FIG. 6. In FIG. 7, a substrate 201 having a top surface 203 is provided.

Isolation feature 206 is formed in the substrate 201 to isolate various regions of the substrate 201. The isolation feature 206 also isolates the PFET regions 202C and NFET region 204C (shown in FIG. 6) from other devices (not shown). An isolation feature 206 is formed in the trench. In this embodiment, the isolation feature 206 refers to a shallow trench isolation (STI) structure (also referred to as the STI structure 206). In the depicted embodiment, a gate structure 208G is formed on the PFET region 202C, and a gate structure 208F is formed on the NFET region 204C. At the same time, a gate strip 208H is formed over the PFET regions 202C and 202D and the isolation feature 206 as shown in FIG. 2. The gate structures 208F and 208G includes a gate dielectric layer, a gate layer 217 and a hard mask layer 212. The gate structure 208F and 208G as well as other gate strips are formed by deposition, lithography patterning, etching processes, or a combination thereof. In the depicted embodiment, a first dielectric cap layer 214 and a second dielectric cap layer 216 are formed over the semiconductor structure 200B. Details of the materials and fabrication methods of the substrate 201, the isolation feature 206, the gate dielectric layer, the gate layer 217, the hard mask layer 212, the first dielectric cap layer 214 and the second dielectric cap layer 216 are similar to those associated with the semiconductor structure 200A and are not repeated here.

Referring now back to FIG. 1, method 100 continues with operation 103 in which a patterned mask layer is formed over the substrate. The patterned mask layer covers the STI structure and a portion of the region, and leaves a remaining portion of the PFET region 202C exposed.

Figure 8:
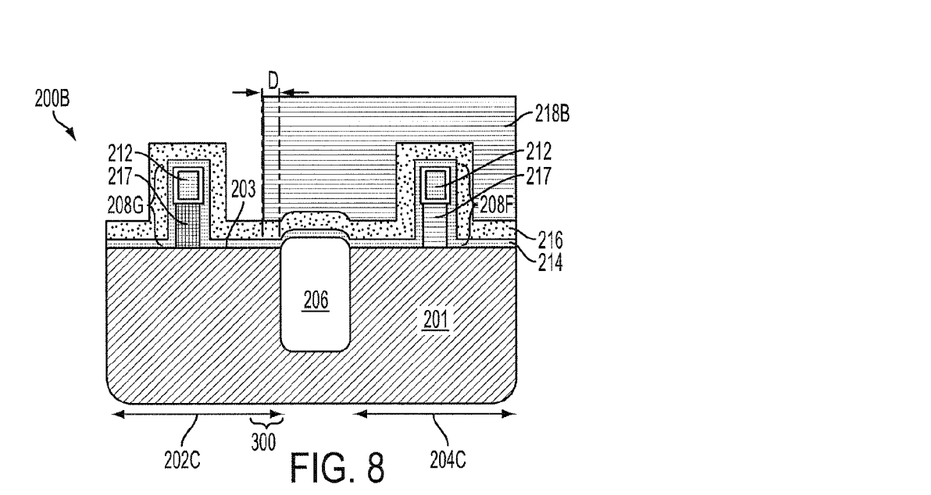

FIG. 8 is a cross-sectional view of the structure 200B after a photoresist layer 218B is formed over the semiconductor structure 200B shown in FIG. 7. The photoresist layer 218B is patterned through a photolithography process. An exemplary photolithography process may include processing steps of photoresist coating, soft baking, mask aligning, exposing, post-exposure baking, developing photoresist, and/or hard baking. The patterned photoresist layer 218B is formed over the STI structure 206, the NFET region 204C and a portion of the PFET 202C region and leaves a remaining portion of the PFET region 202C exposed. This portion of the PFET region 202C covered by the patterned photoresist layer 218B is also referred to as a buffer region 300. A distance (also referred to as a width of the buffer region 300) between an edge of the remaining portion of the PFET region 202C and an edge of the STI structure 206 is substantially longer than 1 nm. The patterned photoresist layer 218B protects the NFET region 204C during processing of the PFET regions 202C. The underlying second dielectric cap layer 216 not covered by the photoresist layer 218B is exposed.

Figure 9:
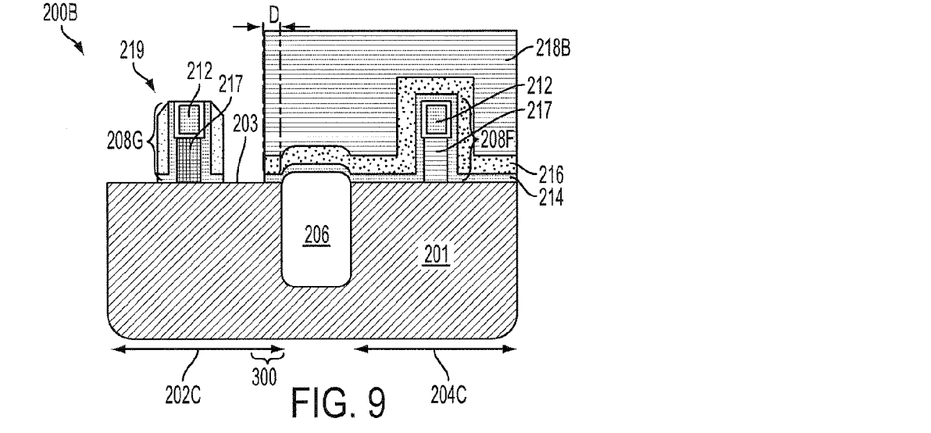

In FIG. 9, a dummy spacer 219 is formed on each sidewall of the gate structure 208G. In the depicted embodiment, the first dielectric cap layer 214 and the second dielectric cap layer 216 are anisotropically etched to form dummy spacers 219 as illustrated in FIG. 9. The top surface 203 in the remaining portion of the PFET region 202C not covered by the dummy spacer 219 and the patterned photoresist layer 218B is exposed. The patterned photoresist layer 218B, the patterned second dielectric cap layer 216 and the patterned first dielectric cap layer 214 forms a patterned composite mask layer. The patterned composite mask layer covers the STI structure 206, the NFET region 204C and the buffer region 300, and leaves a remaining portion of the PFET region 202C exposed. A distance between an edge of the remaining portion of the PFET region 202C and an edge of the STI structure 206 is substantially longer than 1 nm.

Referring now back to FIG. 1, method 100 continues with operation 105 in which the remaining portion of the region is etched thereby forms a recess in the substrate.

Figure 10:
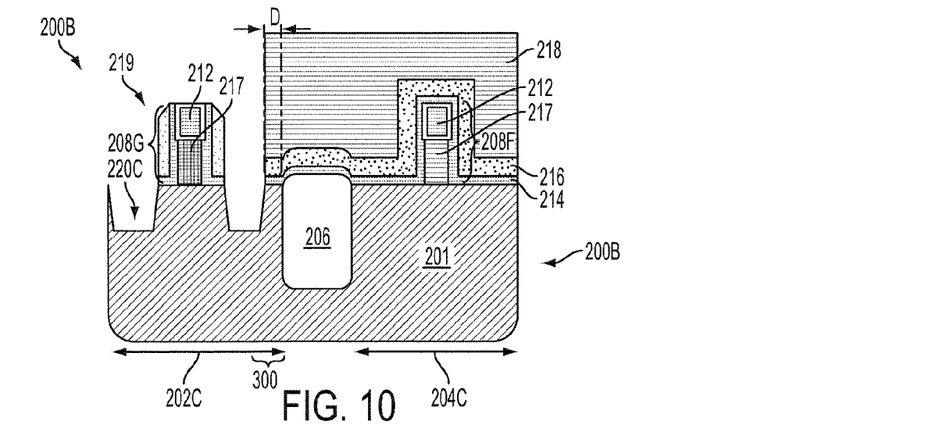

FIG. 10 is a cross-sectional view of the semiconductor structure 200B after performing operation 105. An etching process is performed to remove portions of the substrate 201 not covered by the dummy spacer 219 and the patterned composite mask layer to form a recess 220C in the remaining portion of the PFET region 202C. The etching process includes a dry etching process, wet etching process, or combination thereof. Details of fabrication methods of the recess 220C are similar to those associated with the recess 220B of the semiconductor structure 200A and are not repeated here.

Referring now back to FIG. 1, method 100 continues with operation 107 in which a stressor is epitaxially grown in the recess.

Figure 11:
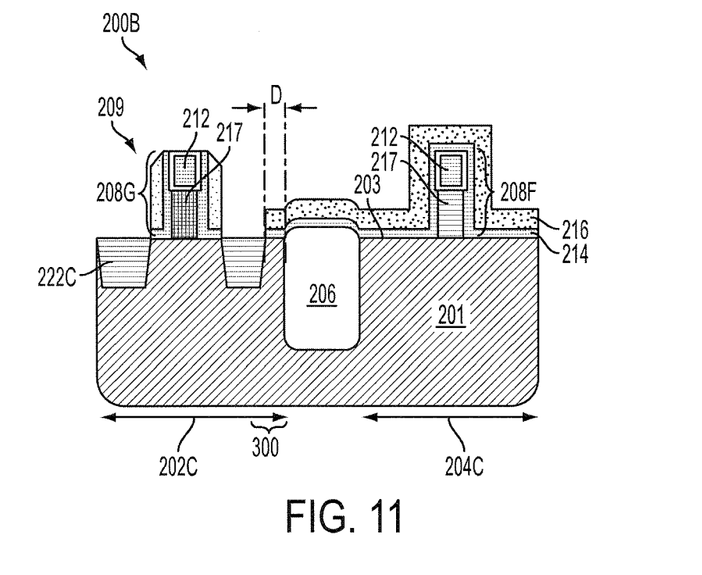

FIG. 11 is a cross-sectional view of the structure 200B after the performance of operation 107 in the recess 220C. A semiconductor material is deposited in the recess 220C to form a strained structure (also referred to as a stressor 222C) in the PFET region 202C. Simultaneously, other stressors 222C are also formed in the PFET region 202D as shown in FIG. 6. In the depicted embodiment, an epitaxy or epitaxial (epi) process is performed to deposit the semiconductor material in the recesses 220C. The recess 220C is completely filled with the stressor 222C at least up to the top surface 203. The stressor 222C has a second top surface. The entire second top surface is not lower than the top surface 203 of the substrate 201. The stressors 222C may further be exposed to annealing processes, such as a rapid thermal annealing process. Thereafter, the dummy spacer 209, the patterned dielectric cap layers 214 and 216 are removed by a suitable process.

Referring now back to FIG. 1, method 100 continues with operation 109 in which a conductive plug contacting the stressor is formed.

Figure 12:
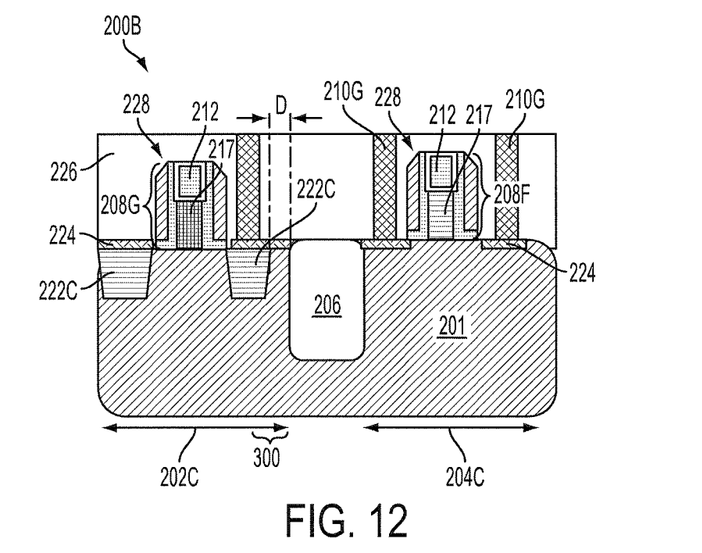

FIG. 12 depicts a cross-sectional view of the structure 200B after performance of operation 109. In one embodiment, lightly doped source/drain (LDD) regions (not shown) are formed in each side of the gate structures 208F and 208G after the operation 107 of the stressor formation. A first implantation process with a first dopant is performed in the substrate 201 in the PFET region 202C and the NFET region 204C. The LDD regions are aligned with the sidewalls of the gate structures 208F and 208G. The NFET region 204C may be protected during formation of the LDD regions in the PFET region 202C, and the PFET region 202C may be protected during formation of the LDD regions in the NFET region 204C. In the depicted embodiment, the LDD regions for the NFET region 204C (NLDD) are doped with an n-type dopant, such as phosphorous or arsenic. The LDD regions for the PFET region 202C (PLDD) are doped with a p-type dopant, such as boron or $BF_2$. In another embodiment, LDD regions are formed after the formation of the gate structures 208F, 208G and 208H before the formation of the stressors.

Then, a material of spacer liner 228A and a material of spacer 228B are formed by blanket deposited over the semiconductor structure 200A. The material of spacer liner 228A and the material of spacer 228B are anisotropically etched to form spacers 228 as illustrated in FIG. 12. The spacers 228 are positioned adjacent the sidewalls of the gate structures 208F and 208G, and also on the sidewalls of the gate strip 208H as shown in FIG. 6.

Then, a second implantation process with a second dopant is performed in the substrate 201 in the PFET region 202C and the NFET region 204C. Source/drain regions (not shown) are formed in the stressor 222C on each side of the gate structures 208F and 208G. For example, heavily doped source/drain (HDD) regions for the NFET region 204C may be formed by ion implantation of n-type dopants, such as phosphorous or arsenic, and HDD regions for the PFET region 202C may be formed by ion implantation of p-type dopants, such as boron. The HDD regions are aligned with the edges of the spacers 228 on the gate structures 208F and 208G. The NFET region 204C may be protected during formation of the HDD regions in the PFET region 202C, and the PFET region 202C may be protected during formation of the HDD regions in the NFET region 204C. In some embodiments, the hard mask layer 212 on the gate structures 208F-H is removed after the formation of source/drain regions. The LDD regions and HDD regions in combine with the stressors 222C form strained source/drain features to enhance carrier mobility and improve device performance.

A silicide process is performed and silicide features 224 are formed on top portions of the stressors 222C, and the substrate between the stressor 222C and the STI structure 206. After the silicide process, an inter-level dielectric (ILD) layer 226 is blanket formed over the semiconductor structure 200B covering the STI structure 206, the stressors 222C and the gate strips 208F-H as shown in FIG. 2. A chemical mechanical polishing (CMP) process is further applied to the semiconductor structure 200B to planarize the ILD layer 226. An opening is etched in the ILD layer 226 to expose a portion of the stressor 222C. A conductive material may overfill the opening in the ILD layer 226. The excess conductive material outside of the opening is removed through a suitable process such as chemical mechanical polishing (CMP). A contact plug 210G having the conductive material is formed on the stressor 222C and contacts the silicide feature 224 on the stressor 222C. It is understood the formation of the contact plug 210G described here for the sake for illustration. In FIG. 6, other contact plugs 210G are also suitable for use of the formation method in this paragraph.

Referring now back to FIG. 1, method 100 continues with operation 111 to complete fabrication. Details of fabrication methods of the operation 111 can be found in text associated with the semiconductor structure 200A and are not repeated here.

Various embodiments of the present disclosure may be used to improve previous manufacturing processes for an integrated circuit having a stressor. For example, this disclosure provides use of the buffer region improves the uniformity of the epitaxy growth rate of SiGe formed in the recesses. Both the buffer region and the recess are a portion of the substrate. The SiGe is grown in the same material of the substrate. Therefore, the grown SiGe gets a uniformly formed top surface. The uniformly formed top surface would enhance capability of the following conductive plug formation process to accurately contact the surface of the SiGe. The leakage current, device performance and yield on the completed products are thus significantly increased. Advantageously, when the width of the buffer region is longer than 1 nm, the width keeps SiGe grown in the same material of the substrate. The width does not occupy a long distance of the active area in the PFET regions. Electrical performance of each stressor within the PFET region could be accurately controlled. Compared with other methods, a method according to this disclosure moderates the shortcoming of a facet plane of SiGe formed in a recess in the proximity to a STI structure. This disclosure is not limited to the above conditions for gate-first processes. The gate replacement processes that produce beneficial effects to improve the uniformity of the grown surface of the stressors are within the scope of this disclosure.

In accordance with one embodiment, a semiconductor structure includes a substrate, a shallow trench isolation (STI) structure embedded in the substrate, a stressor embedded in the substrate, and a conductive plug over and electrically coupled with the stressor. A same-material region is sandwiched by the STI structure and an entire sidewall of the stressor, and the same-material region is a continuous portion of the substrate.

In accordance with another embodiment, a semiconductor structure includes a substrate having a PFET region and a NFET region, a shallow trench isolation (STI) structure separating the PFET region and the NFET region, a stressor embedded in the PFET region and adjacent to the STI structure, and a conductive plug over and electrically coupled with the stressor. A same-material region is sandwiched by the STI structure and an entire sidewall of the stressor, and the same-material region is a continuous portion of the substrate.

In accordance with another embodiment, a semiconductor structure includes a substrate, an isolation structure embedded in the substrate, a stressor embedded in the substrate, and a conductive plug over and electrically coupled with the stressor. The stressor is adjacent to the isolation structure. The isolation structure has a first depth measurable from an upper surface of the substrate. The stressor has a second depth measurable from the upper surface of the substrate, and the second depth is less than the first depth. A same-material region is sandwiched by the isolation structure and an entire sidewall of the stressor, and the same-material region is a continuous portion of the substrate.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, manufacture, compositions of matter, means, methods, or steps.

What is claimed:

1. A semiconductor structure comprising:
   a substrate;
   a shallow trench isolation (STI) structure embedded in the substrate;
   a stressor embedded in the substrate, a same-material region being sandwiched by the STI structure and an entire sidewall of the stressor, and the same-material region being a continuous portion of the substrate; and
   a conductive plug over and electrically coupled with the stressor.

2. The semiconductor structure of claim 1, wherein the substrate has a first top surface, the stressor has a second top surface, and the entire second top surface is not lower than the first top surface.

3. The semiconductor structure of claim 1, further comprising:
   a silicide feature between the stressor and the conductive plug.

4. The semiconductor structure of claim 1, wherein
   the stressor is embedded in a region of the substrate;
   the region is a PFET region; and
   the stressor is configured as a source region or a drain region.

5. The semiconductor structure of claim 1, further comprising:
   another stressor in a PFET region, the another stressor and the stressor being integrally connected, and the another stressor being configured as a source region or a drain region.

6. The semiconductor structure of claim 1, wherein the stressor comprises silicon germanium (SiGe).

7. The semiconductor structure of claim 1, wherein a width of the same-material region measurable between the sidewall of the stressor and a sidewall of the STI structure is greater than 1 nm.

8. A semiconductor structure, comprising:
   a substrate having a PFET region and a NFET region;
   a shallow trench isolation (STI) structure separating the PFET region and the NFET region;
   a stressor embedded in the PFET region and adjacent to the STI structure, a same-material region being sandwiched by the STI structure and an entire sidewall of the stressor, and the same-material region being a continuous portion of the substrate; and
   a conductive plug over and electrically coupled with the stressor.

9. The semiconductor structure of claim 8, wherein the substrate has a first top surface, the stressor has a second top surface, and the entire second top surface is not lower than the first top surface.

10. The semiconductor structure of claim 8, further comprising:
    a dielectric layer over the substrate, covering the STI structure and the stressor, and surrounding the conductive plug.

11. The semiconductor structure of claim 8, further comprising:
    a silicide feature between the stressor and the conductive plug.

12. The semiconductor structure of claim 8, wherein the stressor comprises silicon germanium (SiGe).

13. The semiconductor structure of claim 8, wherein a width of the same-material region measurable between the sidewall of the stressor and a sidewall of the STI structure is greater than 1 nm.

14. A semiconductor structure comprising:
    a substrate;
    an isolation structure embedded in the substrate, the isolation structure having a first depth measurable from an upper surface of the substrate;
    a stressor embedded in the substrate and adjacent to the isolation structure, the stressor having a second depth measurable from the upper surface of the substrate, the second depth being less than the first depth, a same-material region being sandwiched by the isolation structure and an entire sidewall of the stressor, and the same-material region being a continuous portion of the substrate; and
    a conductive plug over and electrically coupled with the stressor.

15. The semiconductor structure of claim 14, wherein the substrate has a first top surface, the stressor has a second top surface, and the entire second top surface is not lower than the first top surface.

16. The semiconductor structure of claim 14, further comprising:
    a silicide feature between the stressor and the conductive plug.

17. The semiconductor structure of claim 14, wherein
    the stressor is configured as a source region or a drain region of a transistor.

18. The semiconductor structure of claim 17, wherein the transistor is a P-type transistor.

19. The semiconductor structure of claim 14, wherein the stressor comprises silicon germanium (SiGe).

20. The semiconductor structure of claim 14, wherein a width of the same-material region measurable between the sidewall of the stressor and a sidewall of the STI structure is greater than 1 nm.

* * * * *